(12) United States Patent
Chang et al.

(10) Patent No.: US 11,282,879 B2
(45) Date of Patent: Mar. 22, 2022

(54) IMAGE SENSOR PACKAGING METHOD, IMAGE SENSOR PACKAGING STRUCTURE, AND LENS MODULE

(71) Applicant: INNO-PACH TECHNOLOGY PTE LTD, Singapore (SG)

(72) Inventors: Liping Chang, Shanghai (CN); Deze Yu, Singapore (SG); Wanning Zhang, Singapore (SG)

(73) Assignee: INNO-PACH TECHNOLOGY PTE LTD, Singapore (SG)

( * ) Notice: Subject to any disclaimer, the term of this patent is extended or adjusted under 35 U.S.C. 154(b) by 64 days.

(21) Appl. No.: 16/757,623

(22) PCT Filed: Sep. 29, 2018

(86) PCT No.: PCT/CN2018/108630
§ 371 (c)(1),
(2) Date: Apr. 20, 2020

(87) PCT Pub. No.: WO2019/076189
PCT Pub. Date: Apr. 25, 2019

(65) Prior Publication Data
US 2020/0343284 A1 Oct. 29, 2020

(30) Foreign Application Priority Data
Oct. 20, 2017 (CN) .................... 201710986559.X

(51) Int. Cl.
*H01L 27/146* (2006.01)
*H01L 21/56* (2006.01)
*H01L 21/768* (2006.01)

(52) U.S. Cl.
CPC ...... *H01L 27/14618* (2013.01); *H01L 21/561* (2013.01); *H01L 21/565* (2013.01);
(Continued)

(58) Field of Classification Search
CPC ......... H01L 27/14618; H01L 27/14632; H01L 21/561; H01L 21/565; H01L 21/568;
(Continued)

(56) References Cited

U.S. PATENT DOCUMENTS 6,548,759 B1    4/2003   Glenn et al.
9,502,455 B2 *  11/2016  Akahoshi ............... H01L 24/19
(Continued)

FOREIGN PATENT DOCUMENTS

CN    103000574 A    3/2013
CN    104485320 A    4/2015
(Continued)

*Primary Examiner* — Jonathan Han
(74) *Attorney, Agent, or Firm* — Muncy, Geissler, Olds & Lowe, P.C.

(57) ABSTRACT

An image sensor packaging method, an image sensor packaging structure and a lens module are disclosed by the present invention provides. With the image sensor packaging method, a plurality of image sensor chips are embedded in a molding layer, thus allowing a greatly reduced thickness and improved slimness of the resulting packaging structure. Moreover, in this packaging method, instead of bonding wires, solder pads are externally connected by thin film metal layer formed on non-photosensitive surface area located on the same side as light-sensing surfaces. This allows a reduced impact on the light-sensing surfaces as well as a shorter distance from each solder pad to a corresponding one of the light-sensing surfaces along the direction parallel to the light-sensing surfaces, when compared to the use of bonding wires. As a result, the size of the image sensor chips is allowed to be further reduced, and using a packaging structure resulting from such image sensor chips to make a lens module is beneficial to space design thereof. For example, it can facilitate miniaturization of the lens module.

8 Claims, 3 Drawing Sheets

(52) U.S. Cl.
CPC ...... *H01L 21/568* (2013.01); *H01L 21/76802* (2013.01); *H01L 21/76877* (2013.01); *H01L 27/14627* (2013.01); *H01L 27/14632* (2013.01); *H01L 27/14636* (2013.01); *H01L 27/14698* (2013.01); *H01L 27/14623* (2013.01); *H01L 27/14645* (2013.01); *H01L 27/14685* (2013.01); *H01L 2224/2401* (2013.01); *H01L 2224/24101* (2013.01); *H01L 2224/24105* (2013.01); *H01L 2224/24155* (2013.01)

(58) Field of Classification Search
CPC ......... H01L 21/76802; H01L 21/76877; H01L 27/14627; H01L 27/14636; H01L 27/14698; H01L 2224/24101; H01L 2224/24155; H01L 2224/2401; H01L 2224/24105; H01L 27/14623; H01L 27/14645; H01L 27/14685; H01L 27/14634; H01L 27/1469; H01L 25/167; H01L 31/107; H01L 27/14643–14663
See application file for complete search history.

(56) References Cited

U.S. PATENT DOCUMENTS

| | | | |
|---|---|---|---|
| 2013/0069252 A1* | 3/2013 | Han | H01L 27/14618 257/787 |
| 2016/0212852 A1* | 7/2016 | Hu | H01L 27/14618 |
| 2018/0102466 A1* | 4/2018 | Herrmann | H01L 25/0753 |
| 2018/0337142 A1* | 11/2018 | Cheng | H01L 24/20 |
| 2019/0074399 A1* | 3/2019 | Masuda | H01L 25/167 |

FOREIGN PATENT DOCUMENTS

| | | |
|---|---|---|
| CN | 105742301 A | 7/2016 |
| CN | 105845635 A | 8/2016 |

* cited by examiner

IMAGE SENSOR PACKAGING METHOD, IMAGE SENSOR PACKAGING STRUCTURE, AND LENS MODULE

TECHNICAL FIELD

The present invention relates to the field of image sensors and, in particular, to an image sensor packaging method, an image sensor packaging structure and a lens module.

BACKGROUND

An image sensor is a semiconductor device that can sense external light and convert it into an electrical signal. With current integrated circuit processes, hundreds or even thousands of image sensor chips can be fabricated on a single wafer and then packaged into individual image sensor packages, which may experience external wiring of solder pads and mounted with lens holders and lenses to form lens modules that can be used in electronic devices such as cameras, smart phones, digital cameras, automotive imaging system and toys.

An existing image sensor packaging method is the so-called chip-on-board (COB) technology in which an image sensor chip is attached to an interconnect board (generally a PCB board) with a conductive or non-conductive adhesive and then electrically wired by lead wire bonding, followed by attaching a piece of protective glass (e.g., infrared glass capable of filtering infrared radiation) to a light-sensing surface of the image sensor chip with an epoxy resin or similar packaging adhesive so as to provide the light-sensing surface with protection.

FIG. 1 is a schematic cross-sectional view of an image sensor package structure resulting from an existing COB packaging process. As shown in FIG. 1, along a direction perpendicular to a light-sensing surface 11 (i.e., area for reception of external light and performing photoelectric conversion) of an image sensor chip 10, the image sensor package structure includes backside metal electrodes 16, an interconnect board 15, the image sensor chip 10 (which in turn includes a substrate 12, the light-sensing surface 11 and solder pads 13), a piece of protective glass 14 covering the light-sensing surface 11 and metal lead wires 17 connecting the solder pads 13 to the interconnect board 15. This sensor package structure, however, has both a large thickness (i.e., the dimension along the vertical direction of FIG. 1) due to the superimposition of the image sensor chip 10 on the interconnect board 15 and a significant distance d from each solder pad 13 to the light-sensing surface 11 on the image sensor chip 10 (parallel to the direction along the light-sensing surface 11), which is generally required to exceed 500 μm by a conventional wire bonding technique to enable the fabrication of the metal lead wires 17 that bridge the solder pads 13 to the interconnect board 15, thus hindering further shrinkage of the image sensor package's footprint area. These will also both place limitations on the size of a lens module subsequently fabricated based on the package structure of FIG. 1.

SUMMARY OF THE INVENTION

It is an object of the present invention to solve the problem that image sensor packaging structure fabricated using conventional COB packaging processes are not slim and have a relatively large thickness.

To this end, in one aspect, the present invention provides an image sensor packaging method comprising:

attaching a plurality of image sensor chips which are spaced apart from one another onto a surface of a carrier board, each of the plurality of image sensor chips comprising a light-sensing surface and a backside opposite to the light-sensing surface, the light-sensing surfaces of the plurality of attached image sensor chips facing toward the same direction;

forming a molding layer, which covers portions of the surface of the carrier board between adjacent image sensor chips, wherein the molding layer has a first surface facing toward a same direction as the light-sensing surfaces and a second surface facing toward a same direction as the backsides, and removing the carrier board, wherein a distance between the first and second surfaces of the molding layer is greater than or equal to a distance between the light-sensing surface and backside of each of the image sensor chips.

Optionally, the molding layer may comprise a thermosetting resin.

Optionally, each of the image sensor chips may further comprise a solder pad, formed in non-photosensitive surface area located on a same side as the light-sensing surface, the solder pad configured to connect the image sensor chip to an external circuitry.

Optionally, the packaging method may further comprise: forming, a number of metal vias penetrating through the molding layer, each of the metal vias filled with a conductive material; forming a front-side structure on the same side as the light-sensing surfaces, each of the front-side structures including a first passivation layer, a thin film metal layer and a second passivation layer, which are sequentially stacked over a surface area excluding the light-sensing surfaces; and forming a backside structure on the backsides of the image sensor chips, each of the backside structures including a third passivation layer that covers each of the second surface and the backsides and a backside metal layer formed over a surface of the third passivation layer, wherein each of the thin film metal layer and the backside metal layer is in contact with the metal vias and the thin film metal layer is also in contact with the solder pads.

Optionally, the packaging method may further comprise: forming first contact holes and second contact holes n the first passivation layer, wherein the thin film metal layer is brought into contact with the metal vias and solder pads by corresponding first contact holes and second contact holes, and forming third contact holes in the third passivation layer, wherein the backside metal layer is brought into contact with the metal vias by corresponding third contact holes.

In another aspect, the present invention also provides an image sensor packaging structure, comprising:

a plurality of image sensor chips spaced apart from one another, each of the plurality of image sensor chips comprising a light-sensing surface and a backside opposite to the light-sensing surface, the light-sensing surfaces of the plurality o image sensor chips facing toward a same direction; and a molding layer surrounding the image sensor chips, the molding layer filling gaps between the image sensor chips, and having a first surface facing toward a same direction as the light-sensing surface and a second surface facing toward a same direction as the backside, wherein a distance between the first and second surfaces of the molding layer is greater than or equal to a distance between the light-sensing surface and backside of each of the image sensor chips.

Optionally, the packaging structure may further comprise:

solder pads, formed on non-photosensitive surface areas located on the same side as the light-sensing surface and configured to connect the image sensor chip to an external circuitry;

metal vias, penetrating through the molding layer, and filled with a conductive material;

a front-side structure provided on the same side as the light-sensing surfaces, the front-side structures including a first passivation layer, a thin film metal layer and a second passivation layer, which are sequentially stacked over a surface portion other than the light-sensing surfaces; and a backside structure provided on the backsides of the image sensor chips, the backside structure including a third passivation layer that covers each of the second surface and the backsides of the image sensor chips, and a backside metal layer provided over a surface of the third passivation layer, wherein the backside metal layer and the thin film metal layer is in contact with the metal vias, and the thin film metal layer is also in contact with the solder pads.

Optionally, first contact holes and second contact holes may be formed in the first passivation layer, through which the thin film metal layer is brought into contact with the metal vias and solder pads, and third contact holes may be formed in the third passivation layer, through which the backside metal layer is brought into contact with the metal vias.

Optionally, the image sensor package may further comprise a protective glass covering each of the second passivation layer and the light-sensing surfaces.

Optionally, each of the solder pads may be spaced apart from a corresponding one of the light-sensing surfaces by a distance that is smaller than 50 µm, along a direction parallel to the light-sensing surface.

Optionally, the molding layer may include a thermosetting resin.

In yet another aspect, the present invention provides a lens module comprising the image sensor packaging structure as defined above.

In the image sensor packaging method provided herein, a plurality of image sensor chips spaced apart from one another are attached to a surface of a carrier board, and a molding layer is then formed, which fills up the gaps between the image sensor chips, followed by removal of the carrier board. The molding layer has a thickness greater than or equal to a thickness of each image sensor chip (both measured in the direction perpendicular to the light-sensing surfaces). Thus, it can be seen that the image sensor chips are embedded in the molding layer. Compared to the conventional COB packaging process, this dispenses with the need to use an interconnect board, leading to a reduced thickness and improved slimness of the resulting image sensor packaging structure. Using such a thinner image sensor package is more likely to obtain a compact lens module.

Further, in the provided image sensor packaging method, instead of metal lead wires formed by a wire bonding process, the solder pads formed on non-photosensitive surface areas located on the same side as the light-sensing surfaces of the image sensor chips are externally connected by thin film metal layers formed by a film-formation process commonly used in the fabrication of semiconductor devices. In this way, a distance of 50 µm or smaller can be obtained from each solder pad to a corresponding light-sensing surface along the direction parallel to the light-sensing surfaces. This allows additional shrinkage of the image sensor chips, which is conducive to achieving a higher degree of integration.

Figure 1:
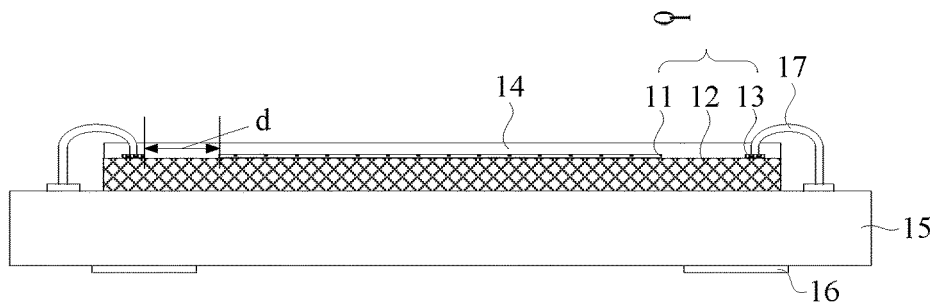
FIG. 1 is a schematic cross-sectional view of an image sensor packaging structure resulting from an existing COB packaging process.

In these figures, 10 and 100: an image sensor chip; 12: a substrate; 16: a backside metal electrode; 15: an interconnect board; 14: protective glass; 17: a metal lead wire; 200; a carrier board; 11 and 100a: a light-sensing surface; 100c: a non-photosensitive surface area; 100b: a backside; 13 and 101: a solder pad; 150: a molding layer; 160: a metal via; 150a: a first surface; 150b: a second surface; 110: a first passivation layer; 120: a thin film metal layer; 130: a second passivation layer; 111: a first contact hole; 112: a second contact hole; 171: a third contact hole; 300: a front-side structure; 400: a backside structure; 170: a third passivation layer; 180: a backside metal layer; and 181: a metal protective film.

DETAILED DESCRIPTION

Specific embodiments of the proposed image sensor packaging method, image sensor packaging structure and lens module will be described in greater detail below with reference to the accompanying drawings. Features and advantages of the invention will be more apparent from the following detailed description and annexed figures. However, it should be noted that the concept of the subject matter of the present invention can be embodied in various forms and is not limited to the particular examples disclosed herein. The figures are provided in a very simplified form not necessarily presented to scale, with their only intention to help in explaining the disclosed embodiments in a convenient and clear way.

As used in the specification and claims, the terms "first", "second" and the like are meant to distinguish similar elements from each other rather than necessarily indicate specific sequential or temporal orderings. It is to be understood that the terms so used are interchangeable under appropriate circumstances such that the embodiments of the invention described herein are, for example, capable of operation in other sequential orderings than those illustrated or otherwise described herein. Likewise, if any method described herein includes a sequence of steps, then the order of the steps presented herein does not have to be the only order in which the steps may be performed, and some of the steps may be omitted and/or some other steps not described herein may be added to the method. If any element in an embodiment of the present invention depicted in one of the accompanying drawings is identical to that in another one or other ones of the drawings, for the sake of clarity, a reference numeral for the element may not be marked in all of these figures even if the element is readily identifiable therein.

As used herein, an image sensor packaging method is meant to refer to a method for packaging image sensor chips to form an image sensor packaging structure.

Figure 2:
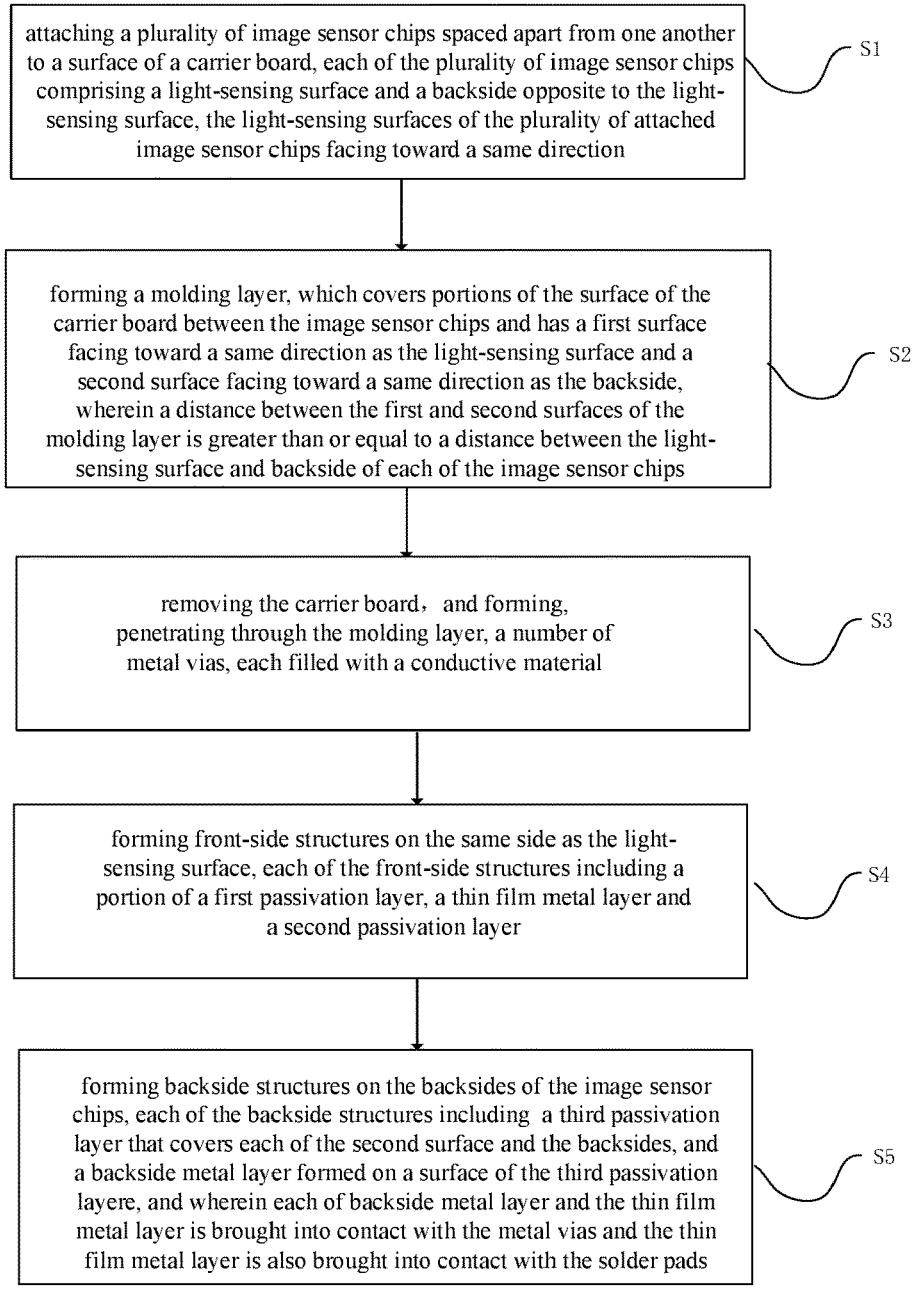
FIG. 2 is a flowchart schematically illustrating an image sensor packaging method according to an embodiment of the present invention.

FIG. 2 is a flowchart schematically illustrating an image sensor packaging method according to an embodiment of the present invention. As shown, the method includes the steps of:

S1: attaching a plurality of image sensor chips which are spaced apart from one another onto a surface of a carrier board, each of the image sensor chips having a light-sensing surface and a backside opposite to the light-sensing surface, each of the image sensor chips including solder pads formed on non-photosensitive surface area located on the same side as the light-sensing surface, the light-sensing surfaces of the plurality of attached image sensor chips facing toward the same direction;

S2: forming a molding layer, which covers portions of the surface of the carrier board between the plurality of image sensor chips and has a first surface facing toward the same direction as the light-sensing surfaces and a second surface facing toward the same direction as the backsides, wherein a distance between the first and second surfaces of the molding layer is greater than or equal to a distance between the light-sensing surface and backside of each of the image sensor chips;

S3: removing the carrier board and forming, penetrating through the molding layer, a plurality of metal vias, each of metal vias filled with a conductive material;

S4: forming a front-side structure on the same side as the light-sensing surfaces, each of the front-side structures including a first passivation layer, a thin film metal layer and a second passivation layer, which are sequentially stacked over a surface portion excluding the light-sensing surfaces; and S5: forming a backside structure on the backsides of the image sensor chips, the backside structures including a third passivation layer that covers each of the second surface and the backsides, and a backside metal layer formed over a surface of the third passivation layer. Each of the backside metal layer and the thin film metal layer is in contact with the metal vias. The thin film metal layer is also in contact with the solder pads.

FIGS. 3a to 3e are schematic cross-sectional views of structures resulting from various steps in an image sensor packaging method according to an embodiment of the present invention. The image sensor packaging method will be described in greater detail below with combined reference to FIG. 2 and FIGS. 3a to 3e.

Figure 3A:
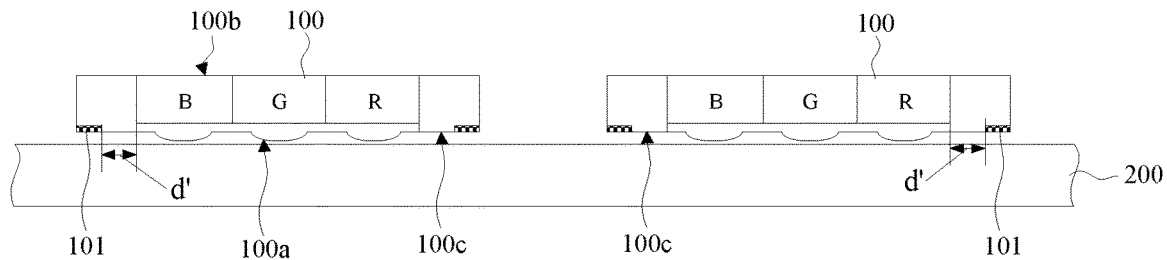
FIGS. 3a to 3e are schematic cross-sectional views of structures resulting from various steps in an image sensor packaging method according to an embodiment of the present invention.

With combined reference to FIG. 2 and FIG. 3a, in step S1, a plurality of image sensor chips 100 are attached to a surface of a carrier board 200 such that they are spaced apart from one another. Each of the image sensor chips 100 has a light-sensing surface 100a and a backside 100b opposite to the light-sensing surface. Each of the image sensor chips 100 includes solder pads 101 formed on non-photosensitive surface area 100c located on the same side as the light-sensing surface 100a. The light-sensing surfaces 100a of the plurality of attached image sensor chips 100 face toward the same direction.

It should be noted that while only two image sensor chips 100 are shown in FIG. 3a, in this embodiment, a plurality of identical image sensor chips 100 can be attached to the surface of the carrier board 200. In another embodiment, in addition to the image sensor chips 100, other functional chips or devices, such as image processing chips, central processing chips, passive components, etc., may also be attached to the surface of the carrier board 200 and spaced apart from one another. Those skilled in the art may make modifications to the number and distribution of the image sensor chips 100 without departing from the scope of the invention.

Specifically, the carrier board 200 may be used as an auxiliary (or temporary) component made of, e.g., glass, ceramic or a polymer. The surface to which the image sensor chips 100 are attached may be flat and assume a square or round shape.

In another embodiment, the carrier board 200 may include a wall arranged on the edge thereof. The wall has a height that may be greater than or equal to a thickness of each image sensor chip 100 (i.e., a distance between the light-sensing surface 100a and the backside 100b thereof). Additionally, the wall may be detachable.

The image sensor chips 100 may be attached to the surface of the carrier board 200 with an adhesive (not shown).

The image sensor chips 100 may be implemented as CMOS or CCD image sensor chips, for example. This embodiment is described with the image sensor chips 100 implemented as CMOS image sensor chips as an example. Each of such image sensor chips 100 has a light-sensing (or photosensitive) surface 100a and a backside 100b opposite to the light-sensing surface 100a. The light-sensing surface 100a may be provided thereon with a micro-lens structure for facilitating the transmission of incident light (mainly visible light). Each image sensor chip 100 may include light-sensing units, respectively corresponding to red (R), green (G) and blue (B) components. The incident light incident to respective light-sensing units is converted to electrical signals through photoelectric conversion. The electrical signals are then transmitted from an internal circuit (not shown) to external circuitry. In this embodiment, on the same side as the light-sensing surface 100a (a surface capable of converting red, green and blue components of light incident on the micro-lens structure to electrical signals), there are also non-photosensitive surface portions 100c (namely a lead-out region of the internal circuit of the image sensor chip 100) on which two solder pads 101 for connecting the internal circuit of the image sensor chip 100 to the external circuitry. In a direction parallel to the light-sensing surface 100a, each of the solder pads 101 is spaced from the light-sensing surface 100a by a distance d'. In other embodiments, only one solder pad 101 may be provided, or the solder pad(s) 101 may be alternatively arranged on the backside 100b of the image sensor chip.

In this embodiment, the light-sensing surfaces 100a may be attached to the carrier board 200 with an adhesive, with the backsides 100b facing away therefrom. However, the present invention is not limited thereto, because in other embodiments, depending on the structure of the image sensor chips 100, the backsides 100b may be alternatively attached to the carrier board 200 with an adhesive.

In this embodiment, the image sensor chips 100 are attached to the surface of the carrier board 200 in a non-continuous manner in which any two of them are spaced apart from each other by a certain distance. In this way, for example, the attached image sensor chips form a chip array across the surface of the carrier board 100. Without limiting the present invention, the distance between the image sensor chips 100 may be determined as required by the placement equipment and the fabrication process.

Figure 3B:
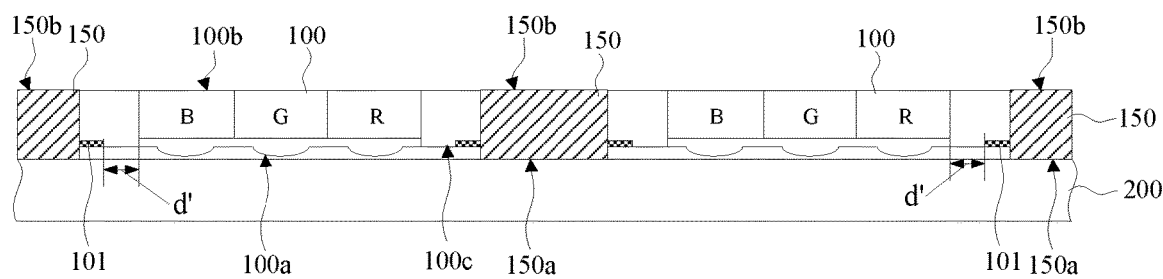

With combined reference to FIGS. 2 and 3b, in step S2, a molding layer 150 is formed so as to cover portions of the surface of the carrier board 200 between the image sensor chips 100. The molding layer 150 has a first surface 150a facing toward the same direction as the light-sensing surfaces 100a and a second surface 150b facing toward the same direction as the backsides 100b. A distance between the first and second surfaces 150a and 150b of the molding layer is greater than or equal to a distance between the light-sensing surface 100a and backside 100b of each image sensor chip 100.

The molding layer 150 may include a material that is at least partially light-absorptive, light-reflective or light-scattering, or an insulating material that is translucent or opaque to visible light (e.g., of a wavelength in the range of 380 to 750 nm), or an insulating material exhibiting near-zero transmittance to infrared radiation (e.g., of a wavelength in the range of 750 nm to 1 mm) The molding layer 150 may include, as a non-limiting example, a thermoplastic resin such as polycarbonate (PC), polyethylene terephthalate (PET), polyethersulfone, polyphenylether, polyamide, polyetherimide, methacrylic or cyclic polyolefin, a thermosetting resin such as an epoxy, phenol, polyurethane, acrylic, vinyl ester, imide-based, polyurethane-based, urea or melamine resin, or an organic insulating material such as polystyrene or polyacrylonitrile.

In another embodiment, the molding layer 150 may include an inorganic insulating material such as an inorganic oxide or nitride such as silicon oxide, silicon nitride, silicon oxynitride, aluminum oxide, titanium oxide, tantalum oxide or zinc oxide, but the present invention is not limited thereto.

In yet another embodiment, the molding layer 150 may include an opaque material such as a black matrix material. The black matrix material may include an organic resin and a resin or paste containing glass slurry and a black pigment.

In this embodiment, the molding layer 150 preferably includes a thermosetting resin such as an epoxy resin, which can ensure good planeness of the molding layer 150 and hence of the image sensor chips 100 under a heated condition, e.g., a planeness variety of the image sensor chips 100 is smaller than 20 µm when tested up to 260° C., while in a conventional COB packaging process under the same test conditions, a planeness variety of the image sensor chips 100 is 70-90 µm.

Specifically, an epoxy resin may be applied to the surface of the carrier board 200 by spin coating. With the image sensor chips 100 spacedly attached onto the surface of the carrier board 200, the molding layer 150 is preferentially distributed on the portions of the surface of the carrier board 200 between the image sensor chips 100. The amount of the applied epoxy resin may be so controlled that the resulting molding layer 150 fills up the gaps between the image sensor chips 100, and a spatula may be then used to make the epoxy resin layer substantially flush with the image sensor chips 100. Alternatively, when within an allowable thickness range, a top surface of the molding layer 150 may protrude beyond the backsides 100d of the image sensor chips 100. Without limiting the present invention, the distance between the first and second surfaces 150a, 150b of the molding layer 150 may be greater than or equal to the distance between the light-sensing surface 100a and backside 100b of any image sensor chip 100. Subsequently, the epoxy resin may be baked and cured. Alternatively, the material of the resulting molding layer 150 applied to the light-sensing surfaces 100a may be removed by, for example, a dry etching process so that the backsides 100b of the image sensor chips 100 are exposed. In this case, it can be considered that the image sensor chips 100 are surrounded by the molding layer 150. In another embodiment, the molding layer 150 distributed in the gaps between the image sensor chips 100 may also be formed by an ink jet printing process. However, the present invention is not limited to any of the above-discussed methods, because the fabrication of the molding layer 150 may be accomplished by any suitable technique selected according to the material thereof.

Figure 3C:
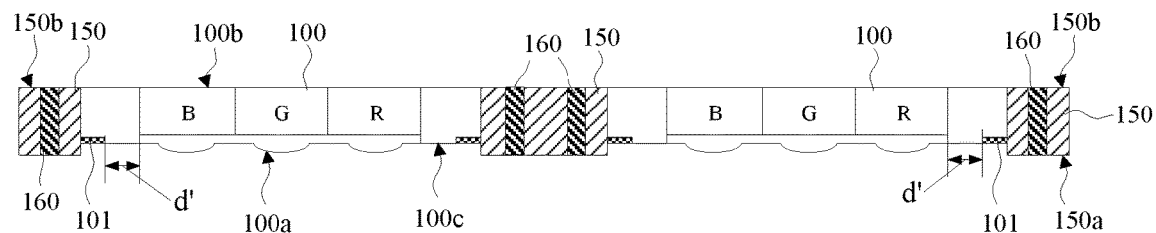

With combined reference to FIGS. 2 and 3c, in step S3, the carrier board 200 is removed, and a number of metal vias 160, penetrating through the molding layer, are formed. The metal vias are filled with conductive material.

In this embodiment, since the image sensor chips 100 are attached to the carrier board 200 by an adhesive such as a hot-melt adhesive, the removal of the carrier board 200 may be accomplished by changing a viscosity of the hot-melt adhesive through heating. It is to be noted that the heating temperature for the hot-melt adhesive should be lower than a curing point of the molding layer 150, in order to avoid posing any adverse impact thereon. In another embodiment, the adhesive may exhibit a variable viscosity and may be located by a laser beam, infrared radiation, ultrasonic waves or any other suitable methods. Heating the carrier board 200 may lower the viscosity of the adhesive, thus enabling the removal of the carrier board 200. In still another embodiment, the removal of the carrier board 200 may also involve applying forces between the carrier board 200 and the light-sensing surfaces 100a of the image sensor chips 100 so as to enable them move in opposite directions. However, the present invention is not limited to any of the above-discussed methods, because the carrier board 200 may also be removed, for example, by laser-assisted peeling or mechanical cutting.

Subsequent to the removal of the carrier board 200, a number of through holes may be formed in the molding layer 150 by mechanical punching, laser drilling, dry etching, etc. The particular method for forming the through holes may be selected based on the material properties of the molding layer 150. In this embodiment, a laser drilling process may be utilized to form through holes in the epoxy molding layer 150. The through holes may be distributed around the image sensor chips 100. That is, one or more through holes may be formed in the molding layer 150 around each image sensor chip 100.

Afterward, a conductive material fills the through holes to form the metal vias 160, which can electrically connect features on one surface of the molding layer 150 to those on the other surface of the molding layer 150. This interconnection method can overcome the limitations of the traditional two-dimensional wiring of semiconductor chips, and various devices and functional modules from different processes are integrated such that a high degree of integration of the resulting chip package can be achieved, the overall performance of the integrated chips is greatly facilitated and optimized. In this embodiment, the metal vias 160 may be formed by filling copper (Cu) in the through holes by, for example, electroplating or electroless plating. However, the present invention is not limited thereto, because any other suitable conductive metal, such as tungsten (W), silver (Ag) or gold (Au), alloy or paste may also be used as the conductive material to form the metal vias 160 by any suitable method well known in the art.

Figure 3D:
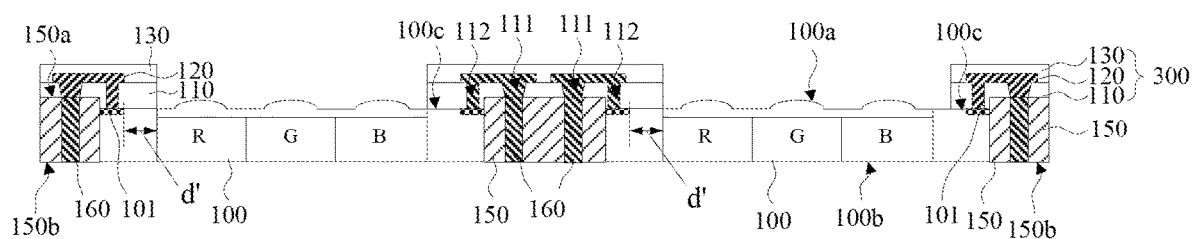

With combined reference to FIGS. 2 and 3d, in step S4, front-side structures 300 are formed on the same side as the light-sensing surfaces 100a. Each of the front-side structures 300 includes a first passivation layer 110, a thin film metal layer 120 and a second passivation layer 130, which are sequentially stacked over a surface area other than the light-sensing surfaces 100a.

The front-side structures 300 are configured as electrical interconnects for connecting the solder pads 101 of the image sensor chips 100 to the external circuitry for controlling some or all of the image sensor chips 100.

Specifically, referring to FIG. 3d (in which the image sensor chips 100 are shown to be flipped over, compared to FIG. 3c, so that the light-sensing surfaces 100a are facing upward), a first passivation layer 110 is formed on the same side as the light-sensing surfaces 100a, which does not cover the light-sensing surfaces 100a (i.e., in this embodiment, it covers both the first surface 150a of the molding layer 150 and the non-photosensitive surface portions 100c). The first passivation layer 110 may have a thickness of, e.g., about 5-25 µm. First contact holes 111 are formed in the first passivation layer 110 right above the respective metal vias 160 and second contact holes 112 are formed in the first passivation layer 110 right above the respective solder pads 101 of the image sensor chips 100. A conductive material then fills the first and second contact holes 111, 112, and a thin film metal layer is formed on a surface of the first passivation layer 110 and patterned into thin film metal layer 120 connecting the respective image sensor chips 100 to corresponding metal vias 160. The resulting thin film metal layer 120 is in contact with the metal vias 160 by the first contact holes 111 and with the solder pads 101 of the image sensor chips 100 by the second contact holes 112. Next, a second passivation layer 130 of a thickness about, e.g., 5-25 µm, is formed, which covers both the first passivation layer 110 and the metal lead wires 120 but not the light-sensing surfaces 100a.

The first and second passivation layers 110, 130 functions to protect the thin film metal layer 120 against a short circuit and are therefore preferably each formed of an insulating material. The materials of the first and second passivation layers 110, 130 may be either the same material or different materials. In this embodiment, the first and second passivation layers 110, 130 may be each form of a polymer such as polyimide, benzocyclobutene (BCB), poly-p-phenylenebenzobisoxazole (PBO) or a combination thereof. The formation of the first and second passivation layers 110, 130 may involve processes including film formation by spin coating, thermal curing, exposure, development, gas-based ashing and demoulding. However, the present invention is not limited thereto, as the film formation and patterning of the first and second passivation layers 110, 130 may be accomplished by any suitable processes selected based on their materials.

The first and second contact holes 111, 112 may be formed, for example, by a dry etching process commonly used in the fabrication of semiconductor devices. Subsequent to the formation of the first and second contact holes 111, 112, a metal seed layer may be formed at inner side and outer side of the first and second contact holes 111, 112 by plasma vapor deposition (PVD) or thermal evaporation, and a metal may be then plated on the metal seed layer to a desired thickness. Next, the metal layer may be patterned to form the thin film metal layer 120 by performing photoresist coating, exposure, development, etching and photoresist removal processes. Specifically, in this embodiment, the thin film metal layer 120 includes a portion of conductive material filling the first and second contact holes 111, 112 and another portion of conductive material forming the patterned metal layer on the surface of the first passivation layer 110.

Specifically, the thin film metal layer 120 may be a conductive metal, such as Cu, Ag, W or Au, alloy or oxide (e.g., ITO). However, the present invention is not limited thereto, as the thin film metal layer 120 may also be a conductive organic material such as a conductive polymer. In some embodiments, the thin film metal layer 120 may also be formed by, for example, printing. The thin film metal layer 120 formed on the surface of the first passivation layer 110 may have a thickness of about 3-10 µm, preferably 3-5 µm.

The thin film metal layer 120 formed by the above semiconductor thin film processes can be used to connect the image sensor chips 10 to the external circuitry. Compared to wire bonding used in the COB packaging process, this will impose a reduced impact on the light-sensing surfaces 100a. In addition, with the method for forming the thin film metal layer 120 according to this embodiment, the distance d' between each solder pad 101 and the corresponding light-sensing surface 100a in the direction along the light-sensing surfaces 100a can be shortened. In contrast to the distance d in the conventional COB packaging process, which was generally greater than 500 µm, d' obtained in this embodiment is 50 µm or smaller. The shorter distance d' is helpful in increasing the degree of integration of the image sensor chips 100 and miniaturizing the packaging structure resulting from the integration of the image sensor chips 100.

Figure 3E:
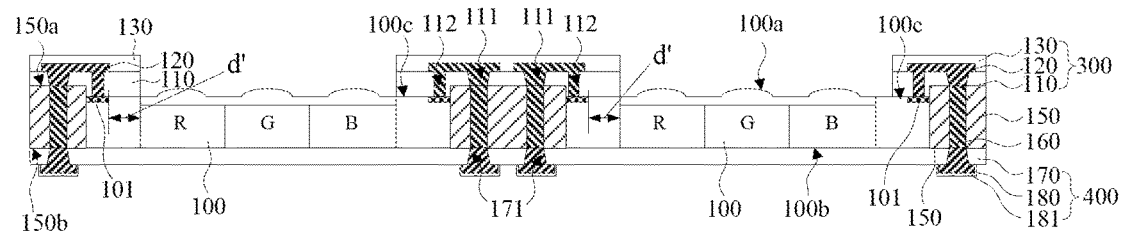

With combined reference to FIGS. 2 and 3e, in step S5, backside structures 400 are formed on the backsides 100b of the image sensor chips 100. Each of the backside structures 400 include a portion of a third passivation layer 170 that covers both the second surface 150b and the backsides 100d and a backside metal layer 180 formed on a surface of the third passivation layer 170. The backside metal layer 180 and the thin film metal layer 120 are both brought into contact with the metal vias 160.

In this embodiment, the third passivation layer 170 may be selected to be formed of the same material by the same film-formation process as the first and second passivation layers 110, 130. The third passivation layer 170 may have a thickness of about 5-50 µm.

Subsequent to the formation of the third passivation layer 170, third contact holes 171 may formed in the third passivation layer 170 right under the respective metal vias 160, and a conductive material that is the same as or different from the conductive material in the metal vias 160 may fill the third contact holes 171. Backside metal layers 180 are then formed, which each covers a corresponding one of the third contact holes 171 and part of the third passivation layer 170. The backside metal layers 180 may be formed either by the same process as used to form the thin film metal layer 120 or by another film-formation process well known in the art of semiconductor technology. In this embodiment, Cu fills the third contact holes 171 by a PVD process, and an electroplating process is then performed to thicken the metal layer, i.e., forming a Cu film on the surface of the third passivation layer 170. The Cu film is then etched to form the backside metal layers 180. Specifically, each of the backside metal layers 180 includes conductive material filling respective one of the third contact holes 171 and patterned conductive layer formed on the surface of the third passivation layer 170 and is brought into contact with a respective one of the metal vias 160 by the third contact hole 171.

In a preferred embodiment, metal protective films 181 are further formed on the surfaces of the respective backside metal layers 180. The metal protective films 181 may be, for example, nickel-gold (NiAu) or tin (Sn) films. The NiAu films may be formed by electroplating, while the Sn films may be formed by soldering.

The image sensor package resulting from steps S1 to S5 is as shown in FIG. 3e, in which the image sensor chips 100 are embedded in the molding layer 150 and are electrically connected to the external circuitry by the front-side and backside structures 300, 400. Subsequently, a lens module may be fabricated by mounting lenses (e.g., a group of optical lenses) and lens holder on the side of the light-sensing surfaces 100a.

In the image sensor packaging method of the present embodiment, the molding layer 150, third passivation layer 170 and backside metal layers 180 together serve as a substrate, and the plurality of image sensor chips 100 are embedded in the molding layer 150, thus allowing a greatly reduced thickness (i.e., the dimension along the direction perpendicular to the light-sensing surfaces 100a) and improved slimness of the resulting packaging structure. Moreover, instead of bonding wires, the solder pads 101 are lead out by thin film metal layers 120 formed on the side of the light-sensing surfaces 100a. This allows a reduced impact on the light-sensing surfaces 100a as well as a shorter distance d' from each solder pad 101 to a corresponding light-sensing surface 100a along the direction parallel to the light-sensing surfaces 100a, when compared to the use of bonding wires. Specifically, the d' value may be reduced to 50 μm or smaller. As a result, the size of the image sensor chips 100 is allowed to be further reduced, resulting in an increased degree of integration of the packaging structure. Using such a packaging structure to form a lens module is beneficial to space design thereof. For example, it can facilitate miniaturization of the lens module.

In the present embodiment, there is also provided an image sensor packaging structure, which, as shown in FIG. 3e, includes:

a plurality of image sensor chips 100 spaced apart from one another, each having a light-sensing surface 100a and a backside 100b opposite to the light-sensing surface 100a and comprising solder pads 101 each formed on a non-photosensitive surface portion located on the same side of the light-sensing surfaces 100a, the light-sensing surfaces 100a of the image sensor chips 100 facing toward the same direction;

a molding layer 150 surrounding the image sensor chips 100, the molding layer 150 filling up the gaps between the image sensor chips 100, the molding layer having a first surface 150a facing toward the same direction as the light-sensing surfaces 100a and a second surface 150b facing toward the same direction as the backsides 100b, wherein a distance between the first and second surfaces 150a, 150b is greater than or equal to a distance between the light-sensing surface 100a and backside 100b of each of the image sensor chips 100;

metal vias 160, which are provided in the molding layer 150 and each filled with a conductive material;

a front-side structure 300, provided on the same side as the light-sensing surfaces 100a, each of the front-side structures 300 including a first passivation layer 110, a thin film metal layer 120 and a second passivation layer 130, which are sequentially stacked over a surface portion excluding the light-sensing surfaces 100a; and a backside structure 400, provided on the backsides 100b of the image sensor chips 100, each of the backside structures 400 including a third passivation layer 170 that covers both the second surface 150b of the molding layer 150 and the backsides 100b of the image sensor chips 100, and a backside metal layer 180 formed on a surface of the third passivation layer 170, wherein the backside metal layers 170 and the thin film metal layers 120 are both brought into contact with the metal vias 160 and the thin film metal layers 120 are also brought into contact with the solder pads 101.

Specifically, first and second contact holes 111, 112 filled with a conductive material may be formed in the first passivation layer 110, through which the thin film metal layer 120 is brought into contact with the metal vias 160 and the solder pads 101 of the image sensor chips 100, respectively. Third contact holes 171 filled with a conductive material may be formed in the third passivation layer 170, through which the backside metal layers 180 are brought into contact with the metal vias 160.

In this embodiment, a metal protective film 181 such as a NiAu or Sn layer, may be disposed on the backside metal layers 180.

Additionally, in this embodiment, the image sensor packaging structure may further include a protective glass covering both the second passivation layer 130 and the light-sensing surfaces 100a. The protective glass may be infrared glass capable of blocking and/or filtering infrared radiation (e.g., of a wavelength of from 750 nm to 1 mm) In a preferred embodiment, the protective glass may be selected to exhibit zero or near-zero transmittance to infrared radiation. The protective glass may be attached to the second passivation layer 130 with an adhesive layer of a thickness of, for example, approximately 10 μm.

In this embodiment, since the molding layer 150 fills up the gaps between the image sensor chips 100 with the light-sensing surfaces 100a in such a manner that the first surface 150a is flush with or higher than the light-sensing surfaces 100a, and because the front-side structures 300 each including a first passivation layer 110, a thin film metal layer 120 and a second passivation layer 130 are located on the surface of the molding layer 150a, the protective glass located above and covering the light-sensing surfaces 100a may not be in contact with the light-sensing surfaces 100a. This can avoid a load applied to the protective glass from exerting any adverse impact on any of the light-sensing surfaces 100a.

In the present embodiment, there is also provided a lens module incorporating an image sensor packaging structure as shown in FIG. 3e.

The lens module may include one or more optical lenses for use in, for example, a mobile phone camera. The optical lenses cover both the second passivation layer 130 and the light-sensing surfaces 100a. The optical lenses may be glued to the second passivation layer 130 (or to the protective glass when present). Alternatively, the optical lenses may be mounted on a lens holder, which is in turn fixed to the image sensor packaging structure.

In the lens module of the present embodiment, the molding layer 150, third passivation layer 170 and backside metal layers 180 together serve as a substrate of the image sensor packaging structure, and the plurality of image sensor chips 100 are embedded in the molding layer 150, thus dispensing with the use of a PCB substrate. Compared with the conventional COB packaging process, a greatly reduced thickness of the image sensor packaging structure in the lens module and a shorter lateral distance d' (i.e., shorter than the conventional distance d achieved by CMOB packaging process) from each solder pad 101 to a corresponding light-sensing surface 100a (along the direction parallel to the light-sensing surfaces 100a) in the image sensor packaging structure can be obtained, which allows further slimness and miniaturization of the packaging structure. Accordingly, using such a packaging structure to form the lens module is beneficial to space design thereof. For example, it can facilitate miniaturization of the lens module.

It is noted that the methods and packaging structure in the foregoing embodiments are described in a progressive manner, with each subsequent embodiment highlighting their differences from the previous one(s). As the packaging structure have similar features as the respective methods, they are described in a simpler manner, and reference can be made to the description of the methods for relevant details.

The preferred embodiments presented above are merely examples and are in no way meant to limit the present invention. Possible modifications and variations may be made to the subject matter of the present invention by those skilled in the art based on the above teachings without departing from the scope of the present invention. Accordingly, any simple variations, equivalent changes and modifications made to the foregoing embodiments based on the substantive disclosure of the present invention without departing from the scope of the present invention fall within the scope thereof.

What is claimed is:

1. An image sensor packaging method, comprising:
    attaching a plurality of image sensor chips which are spaced apart from one another onto a surface of a carrier board, each of the plurality of image sensor chips comprising a light-sensing surface and a backside opposite to the light-sensing surface, the light-sensing surfaces of the plurality of attached image sensor chips facing toward a same direction;
    forming a molding layer, which covers only portions of the surface of the carrier board between adjacent image sensor chips without covering the image sensor chips, wherein the molding layer has a first surface facing toward a same direction as the light-sensing surfaces and a second surface facing toward a same direction as the backsides, and
    removing the carrier board,
    wherein a distance between the first and second surfaces of the molding layer is greater than or equal to a distance between the light-sensing surface and backside of each of the image sensor chips, wherein the method further comprises:
    forming a plurality of metal vias penetrating through the molding layer, each of the metal vias filled with a conductive material;
    forming a front-side structure on the same side as the light-sensing surfaces, the front-side structure including a first passivation layer, a thin film metal layer and a second passivation layer, which are sequentially stacked over a surface area excluding the light-sensing surfaces; and
    forming a backside structure over the backsides of the image sensor chips, the backside structure including a third passivation layer that covers each of the second surface and the backsides, and a backside metal layer formed over a surface of the third passivation layer,
    forming first contact holes and second contact holes in the first passivation layer, wherein the thin film metal layer is brought into contact with the metal vias and the solder pads by the first contact holes and second contact holes, respectively; and forming third contact holes in the third passivation layer, wherein the backside metal layer is brought into contact with the metal vias by the third contact holes,
    and wherein each of the first and second contact holes penetrates through the first passivation layer, and each of the third contact holes penetrates through the third passivation layer.

2. The image sensor packaging method of claim 1, wherein each of the image sensor chips further comprises a solder pad formed in a non-photosensitive surface area located on a same side as the light-sensing surface, the solder pad configured to connect the image sensor chip to an external circuitry.

3. The image sensor packaging method of claim 1, wherein the molding layer comprises a thermosetting resin.

4. An image sensor packaging structure, comprising:
    a plurality of image sensor chips spaced apart from one another, each of the plurality of image sensor chips comprising a light-sensing surface and a backside opposite to the light-sensing surface, the light-sensing surfaces of the plurality of image sensor chips facing toward a same direction; and
    a molding layer surrounding the image sensor chips, the molding layer only filling gaps between the image sensor chips without covering the image sensor chips and having a first surface facing toward a same direction as the light-sensing surfaces and a second surface facing toward a same direction as the backsides,
    wherein a distance between the first and second surfaces of the molding layer is greater than or equal to a distance between the light-sensing surface and backside of each of the image sensor chips,
    wherein the image sensor packaging structure further comprises:
    solder pads, formed on non-photosensitive surface areas located on a same side as the light-sensing surfaces and configured to connect the image sensor chips to an external circuitry;
    metal vias, penetrating through the molding layer and filled with a conductive material;
    a front-side structure provided on the same side as the light-sensing surfaces, the front-side structure including a first passivation layer, a thin film metal layer and a second passivation layer, which are sequentially stacked over a surface area excluding the light-sensing surfaces; and
    a backside structure provided over the backsides of the image sensor chips, the backside structure including a third passivation layer that covers each of the second surface and the backsides of the image sensor chips, and a backside metal layer provided over a surface of the third passivation layer,
    wherein first contact holes and second contact holes are formed in the first passivation layer, through which the thin film metal layer is brought into contact with the metal vias and the solder pads, respectively, and wherein third contact holes are formed in the third passivation layer, through which the backside metal layer is brought into contact with the metal vias,
    and wherein each of the first and second contact holes penetrates through the first passivation layer, and each of the third contact holes penetrates through the third passivation layer.

5. The image sensor packaging structure of claim 4, further comprising a protective glass covering each of the second passivation layer and the light-sensing surfaces.

6. The image sensor packaging structure of claim 4, wherein along a direction parallel to the light-sensing surface, each of the solder pads is spaced apart from a corresponding one of the light-sensing surfaces by a distance that is smaller than 50 μm.

7. The image sensor packaging structure of claim 4, wherein the molding layer comprises a thermosetting resin.

8. A lens module, comprising the image sensor packaging structure as defined in claim 4.

* * * * *